(12) United States Patent
Su et al.

(10) Patent No.: US 9,468,101 B2
(45) Date of Patent: Oct. 11, 2016

(54) MICROVIA STRUCTURE OF FLEXIBLE CIRCUIT BOARD AND MANUFACTURING METHOD THEREOF

(71) Applicant: ADVANCED FLEXIBLE CIRCUITS CO., LTD., Taoyuan County (TW)

(72) Inventors: Kuo-Fu Su, Taoyuan County (TW); Gwun-Jin Lin, Taoyuan County (TW)

(73) Assignee: Advanced Flexible Circuits Co., Ltd., Zhongli (TW)

( * ) Notice: Subject to any disclaimer, the term of this patent is extended or adjusted under 35 U.S.C. 154(b) by 0 days.

(21) Appl. No.: 14/659,977

(22) Filed: Mar. 17, 2015

(65) Prior Publication Data

US 2016/0183371 A1    Jun. 23, 2016

(30) Foreign Application Priority Data

Dec. 17, 2014   (TW) .............................. 103144015 A

(51) Int. Cl.

| H05K 1/00 | (2006.01) |
|---|---|
| H05K 1/11 | (2006.01) |
| H05K 1/09 | (2006.01) |
| H05K 3/40 | (2006.01) |
| H05K 3/06 | (2006.01) |

(52) U.S. Cl.
CPC .............. H05K 1/115 (2013.01); H05K 1/092 (2013.01); H05K 3/06 (2013.01); H05K 3/4038 (2013.01)

(58) Field of Classification Search
CPC ............ H05K 1/01; H05K 1/11; H05K 1/44; H05K 3/00; H05K 3/12; H05K 3/40; H05K 3/42; H01L 21/00; H01L 21/02; H01L 21/06; H01L 21/48; H01L 21/70; H01L 23/522

USPC ......... 174/254, 250, 255, 260–263; 257/700, 257/774; 216/13, 17, 18; 438/597, 618, 438/623, 667; 156/272.2, 275.5; 29/830, 29/852
See application file for complete search history.

(56) References Cited

U.S. PATENT DOCUMENTS

| 4,323,593 A | * | 4/1982 | Tsunashima | ......... H05K 3/1225 118/504 |
|---|---|---|---|---|
| 4,935,584 A | * | 6/1990 | Boggs | .................... H05K 1/115 174/262 |
| 5,260,518 A | * | 11/1993 | Tanaka | ................ H01L 21/4853 174/255 |
| 5,731,047 A | * | 3/1998 | Noddin | ................ H05K 3/0035 216/17 |
| 5,786,613 A | * | 7/1998 | Kalnitsky | ........... H01L 27/0251 257/355 |

(Continued)

*Primary Examiner* — Xiaoliang Chen
(74) *Attorney, Agent, or Firm* — Rosenberg, Klein & Lee

(57) ABSTRACT

Disclosed urea microvia structure of a flexible circuit board and a manufacturing method thereof. A first through hole is formed in a first conductive layer of a flexible circuit board and a first exposed zone is defined. A second conductive layer includes a second through hole formed therein and defines a second exposed zone. A dielectric layer includes a dielectric layer through hole corresponding to the second through hole of the second conductive layer. A conductive paste layer is filled in the second through hole of the second conductive layer, the dielectric layer through hole of the dielectric layer, and the first through hole of the first conductive layer in such a way that the conductive paste layer covers and electrically contacts the first exposed zone of the first conductive layer and the second exposed zone of the second conductive layer.

10 Claims, 8 Drawing Sheets

(56) References Cited

U.S. PATENT DOCUMENTS

| | | | | |
|---|---|---|---|---|
| 5,841,075 A * | 11/1998 | Hanson | H01L 21/486 174/250 |
| 5,872,338 A * | 2/1999 | Lan | H01L 21/4857 174/255 |
| 6,039,889 A * | 3/2000 | Zhang | H05K 3/0038 216/13 |
| 6,276,055 B1 * | 8/2001 | Bryan | H05K 3/0094 29/830 |
| 6,541,755 B1 * | 4/2003 | Fujita | B82Y 20/00 250/214.1 |
| 6,631,558 B2 * | 10/2003 | Burgess | B23K 26/0853 205/125 |
| 6,671,951 B2 * | 1/2004 | Nishii | H05K 3/0032 174/202 |
| 8,440,916 B2 * | 5/2013 | Li | H05K 3/0032 174/250 |
| 2001/0023532 A1 * | 9/2001 | Fujii | H01L 21/4857 29/830 |
| 2001/0032700 A1 * | 10/2001 | Nishii | H05K 3/0032 156/272.2 |
| 2002/0020557 A1 * | 2/2002 | Nishii | H05K 3/0032 174/262 |
| 2002/0031650 A1 * | 3/2002 | Fischer | H01L 21/4857 428/209 |
| 2002/0151165 A1 * | 10/2002 | Chung | H01L 21/76844 438/618 |
| 2002/0157862 A1 * | 10/2002 | Nishii | H05K 3/0032 174/255 |
| 2002/0195715 A1 * | 12/2002 | Cho | H01L 21/31116 257/774 |
| 2004/0150103 A1 * | 8/2004 | Cooney, III | H01L 21/76802 257/734 |
| 2004/0152295 A1 * | 8/2004 | Cooney, III | H01L 21/76805 438/623 |
| 2006/0009065 A1 * | 1/2006 | Lee | H01L 21/76808 439/395 |
| 2006/0226537 A1 * | 10/2006 | Okabe | H01L 21/486 257/700 |
| 2007/0218671 A1 * | 9/2007 | Oryoji | H01L 21/2855 438/597 |
| 2012/0115327 A1 * | 5/2012 | Miki | H01L 21/3081 438/667 |
| 2014/0151896 A1 * | 6/2014 | Erickson | H01L 23/481 257/774 |
| 2014/0374147 A1 * | 12/2014 | Lin | H05K 1/0225 174/254 |
| 2014/0374148 A1 * | 12/2014 | Su | H05K 3/4061 174/254 |

* cited by examiner

MICROVIA STRUCTURE OF FLEXIBLE CIRCUIT BOARD AND MANUFACTURING METHOD THEREOF

BACKGROUND OF THE INVENTION

1. Field of the Invention

The present invention relates to a flexible circuit board microvia technology and in particular to a microvia structure of a flexible circuit board and a manufacturing method thereof, which provide advantages of enlarged conductive contact surface area, reduced impedance, and ensured conduction reliability.

2. The Related Arts

The flexible circuit technology has been widely used in all sorts of electronic equipment, communication equipment, and instruments. To achieve a desired circuit arrangement, it is common to form conductive traces and via structures on and in a flexible circuit board. FIG. 1 is a schematic view that illustrates a conventional via structure formed in a flexible circuit board. The flexible circuit board has a structure that comprises a dielectric layer, a first conductive layer, and a second conductive layer, in which the first conductive layer and the second conductive layer are respectively formed on a first surface and a second surface of the dielectric layer.

To form a via structure in the flexible circuit board, commonly, a through hole is formed in the flexible circuit board and electroplating is applied to for an electroplated layer (such as a copper layer) on a wall of the through hole. Etching is then applied to form the conductive traces so that predetermined ones of the conductive traces of the first and second conductive layers are in electrical connection with each other through the electroplated layer.

The conventional via structure of the flexible circuit board, although fit to the uses of the electronic circuits, no longer satisfies the need of the modern industries when the conductive traces and spacing distances therebetween get smaller and smaller. Further, the via structure that is formed with the known technology involves a large thickness of electroplated copper, which does not suit the need of the modern industries and is adverse to the use of the flexible circuit board.

SUMMARY OF THE INVENTION

In view of the drawbacks of the prior art, an object of the present invention is to provide a microvia structure of a flexible circuit board. The present invention provides through holes formed in two conductive layers of the flexible circuit board and exposed zones defined therein, which are filled with a conductive paste layer to form a microvia structure in the flexible circuit board, so that the microvia structure so formed comprises an enlarged conductive contact surface area so as to reduce circuit impedance and ensure conduction reliability.

Another object of the present invention is to provide a method for manufacturing a microvia structure of a flexible circuit board with which the present invention simplifies a manufacturing process with which a microvia structure can be formed in a flexible circuit board with application of electroplating.

The technical solution that the present invention adopts to achieve the above objects is that a first conductive layer of a flexible circuit board comprises a first through hole formed therein and has a first exposed zone defined thereon; a second conductive layer comprises a second through hole formed therein and has a second exposed zone defined thereon; and a dielectric layer comprises a dielectric layer through hole formed therein to correspond to the second through hole of the second conductive layer. A conductive paste layer is filled in the second through hole of the second conductive layer, the dielectric layer through hole of the dielectric layer, and the first through hole of the first conductive layer in such a way that the conductive paste layer covers and electrically contacts the first exposed zone of the first conductive layer and the second exposed zone of the second conductive layer.

In a preferred embodiment of the present invention, the conductive paste layer has a bottom part projecting beyond the bottom surface of the first conductive layer so as to form a curved cap on the bottom surface of the first conductive layer.

The conductive paste layer is made of one of silver, aluminum, copper, conductive carbon paste, adhesive material containing conductive particles.

The first conductive layer and the second conductive layer may each comprise an insulation layer formed thereon.

The bottom surface of the first conductive layer and the first insulation layer further comprises a lower protective layer interposed therebetween.

The top surface of the second conductive layer and the second insulation layer further comprises an upper protective layer interposed therebetween.

An antioxidation layer is formed on a surface of each of the second through hole, the dielectric layer through hole, the first through hole, the first exposed zone, the second exposed zone, and the third exposed zone.

In the efficacy, compared to the prior art, the present involve a simple process that allows for formation of a microvia structure in a flexible circuit board without application of electroplating. Further, in the present invention, the conductive paste layer is filled in the second through hole of the second conductive layer, the dielectric layer through hole of the dielectric layer, and the first through hole of the first conductive layer in such a way that the conductive paste layer effectively covers and contacts the first exposed zone of the first conductive layer and the second exposed zone of the second conductive layer so as to enlarge a conductive contact surface area, reduce circuit impedance, and ensure conduction reliability.

In the present invention, after the formation of the micro hole structure in the flexible circuit board is completed, a surface antioxidation treatment may be conducted first to form an antioxidation layer on a surface of each of the exposed zones and through holes of the micro hole structure. In the present invention, an upper covering layer and a lower covering layer used each comprise a structure of a protection layer so as to prevent invasion of the electroplating solution during the surface antioxidation treatment.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Referring to FIGS. 2-8, schematic views, in a sectioned form, are given to illustrate the manufacture of a microvia structure of a flexible circuit board according to a first embodiment of the present invention. FIG. 9 is a flow chart illustrating the process of the first embodiment of the present invention. The structure and the manufacturing method of the first embodiment of the present invention will be described with reference to FIGS. 2-9.

Figure 1:
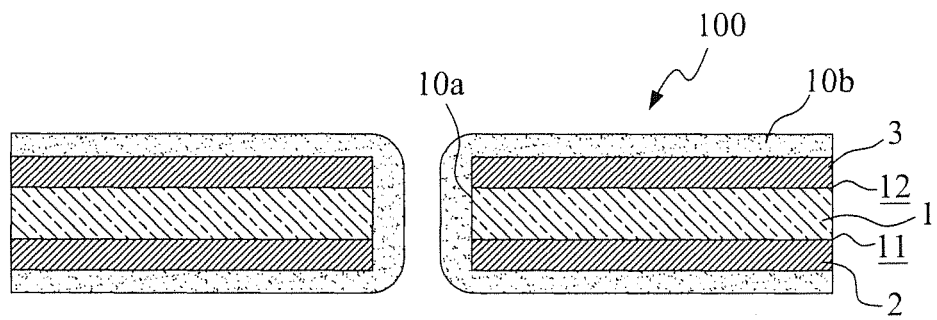
FIG. 1 is a schematic view showing a conventional via structure of a flexible circuit board.
Figure 2:
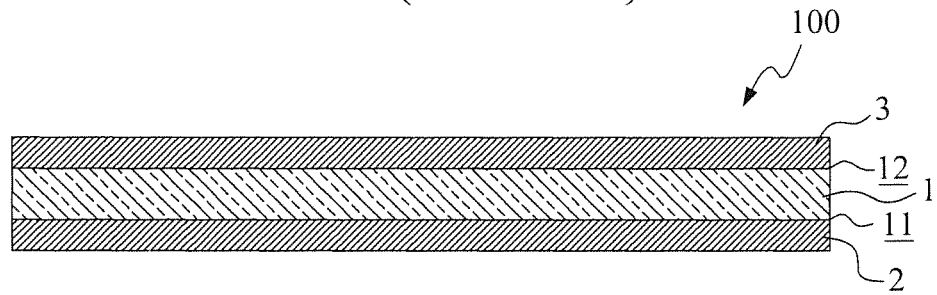
FIG. 2 is a schematic view illustrating a flexible circuit board is first prepared according to the present invention.

As shown in FIG. 2, in the manufacture of the microvia structure of the flexible circuit board according to the present invention, a flexible circuit board 100 (Step 101) is first prepared. The flexible circuit board 100 comprises a dielectric layer 1, a first conductive layer 2, and a second conductive layer 3, in which the first conductive layer 2 and the second conductive layer 3 are respectively formed on a first surface 11 and a second surface 12 of the dielectric layer 1.

Figure 3:
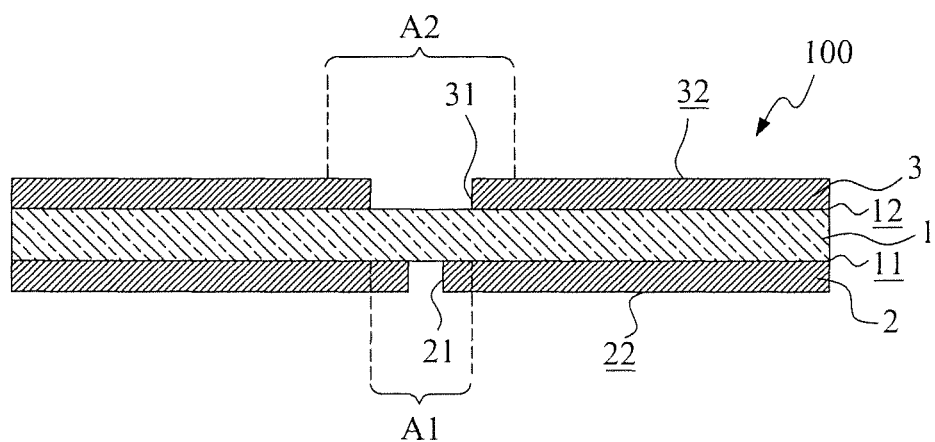
FIG. 3 is a schematic view illustrating formation of a first through hole and a second through hole respectively in a first conductive layer and a second conductive layer of the flexible circuit board of FIG. 2 through etching.

As shown in FIG. 3, a first through hole 21 is formed in the first conductive layer 2 (Step 102) to expose the first surface 11 of the dielectric layer 1; a second through hole 31 is formed in the second conductive layer 3 to expose the second surface 12 of the dielectric layer 1 (Step 103). The second through hole 31 of the second conductive layer 3 is formed at a location corresponding to the first through hole 21 of the first conductive layer 2, and the second through hole 31 has a diameter greater than a diameter of the first through hole 21.

The first conductive layer 2 comprises a bottom surface 22. A first exposed zone A1 is defined on the a surface of the first conductive layer 2 that is opposite to the bottom surface 22 (namely the surface facing the first surface 11 of the dielectric layer 1) in a circumferential area adjacent to the first through hole 21.

The second conductive layer 3 comprises a top surface 32. A second exposed zone A2 is defined on the top surface 32 in a circumferential area adjacent to the second through hole 31.

Figure 4:
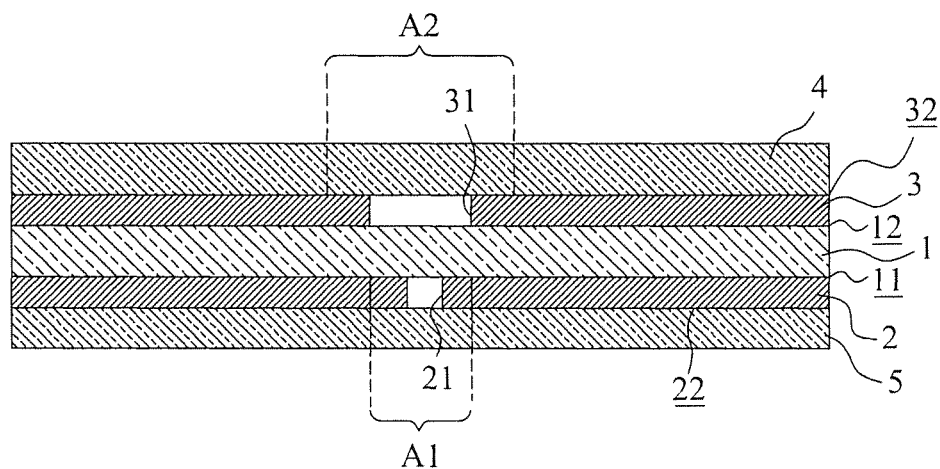
FIG. 4 is a schematic view illustrating formation of an upper covering layer and a lower covering layer on the flexible circuit board of FIG. 3 according to a first embodiment of the present invention.

As shown in FIG. 4, in the first embodiment of the present invention, an upper covering layer 4 is formed on the top surface 32 of the second conductive layer 3 (Step 104). The upper covering layer 4 is formed through coating of an ink material. The embodiment of the present invention may additionally comprise a lower covering layer 5 formed on the bottom surface 22 of the first conductive layer 2.

Figure 5:
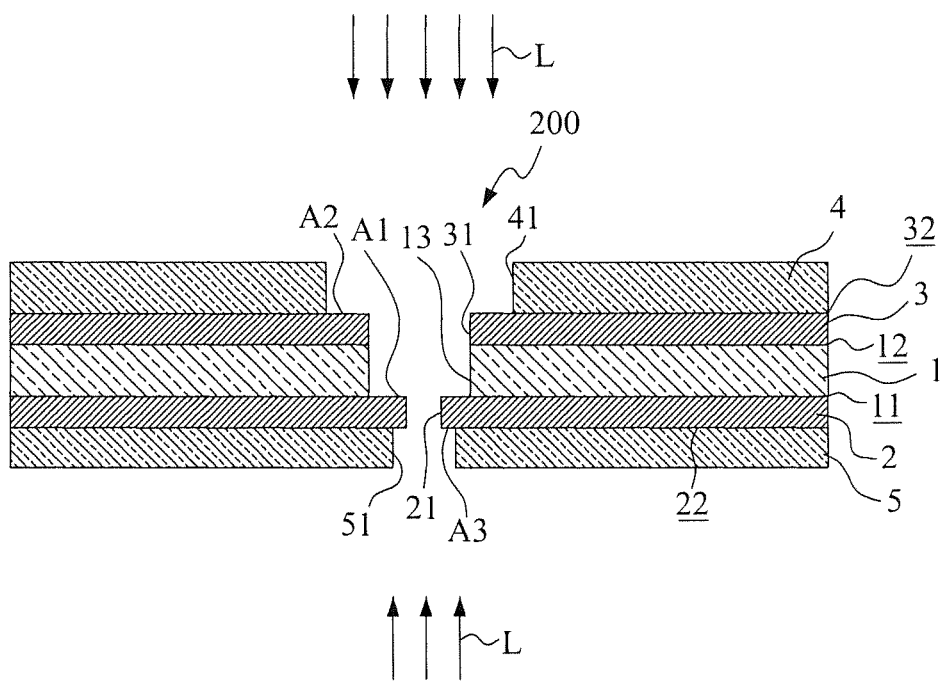
FIG. 5 is a schematic view illustrating formation of a micro hole structure in the flexible circuit board of FIG. 4.

Afterwards, as shown in FIG. 5, a laser energy L or other means is applied to form a top uncovered zone 41 in the upper covering layer 4 (Step 105). The top uncovered zone 41 corresponds exactly to the second exposed zone A2, so as to expose the second exposed zone A2 of the second conductive layer 3.

A bottom uncovered zone 51 is also formed in the lower covering layer 5 (Step 106). The bottom uncovered zone 51 has a diameter greater than the diameter of the first through hole 21 of the first conductive layer 2 so as to define a third exposed zone A3 on the bottom surface 22 of the first conductive layer 2.

Further, the second conductive layer 3 can be used as a mask to form a dielectric layer through hole 13 in the dielectric layer 1 to correspond to the second through hole 31 (Step 107). Since the dielectric layer through hole 13 corresponds to the second through hole 31 of the second conductive layer 3, the first exposed zone A1 of the first conductive layer 2 is exposed. After the above steps, a micro hole structure 200 is formed in the flexible circuit board 100.

Figure 6:
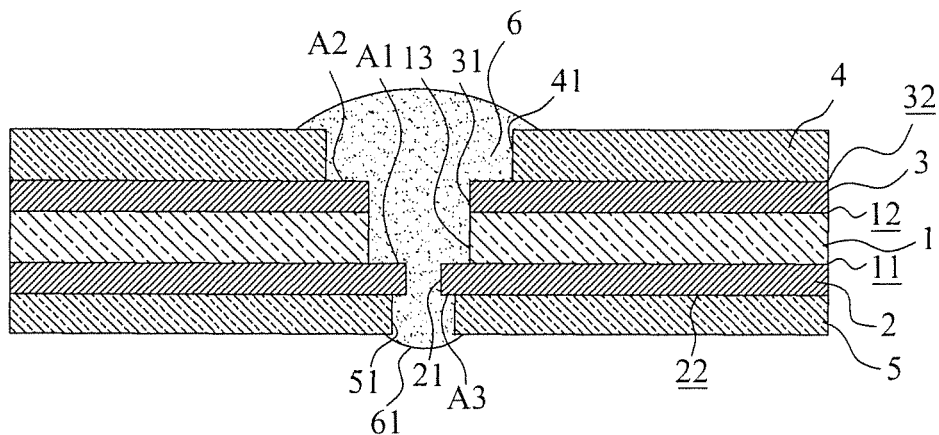
FIG. 6 is a schematic view illustrating filling of a conductive paste layer in the micro hole structure of FIG. 5.

Then, as shown in FIG. 6, a conductive paste layer 6 filled in the top uncovered zone 41 of the upper covering layer 4, the second through hole 31 of the second conductive layer 3, the dielectric layer through hole 13 of the dielectric layer 1, and the first through hole 21 of the first conductive layer 2 (Step 108) in such a way that the conductive paste layer 6 covers and electrically contacts the first exposed zone A1 of the first conductive layer 2 and the second exposed zone A2 of the second conductive layer 3. The conductive paste layer 6 can be made of one of silver, aluminum, copper, conductive carbon paste, adhesive material containing conductive particles.

When the conductive paste layer 6 is filled into the first through hole 21 of the first conductive layer 2, a bottom part of the conductive paste layer 6 extends through the first through hole 21 of the first conductive layer 2 and projects beyond the bottom surface 22 of the first conductive layer 2 so as to form a curved cap 61 on the bottom surface 22 of the first conductive layer 2. The curved cap 61 covers and electrically contacts the third exposed zone A3 of the first conductive layer 2.

Figure 7:
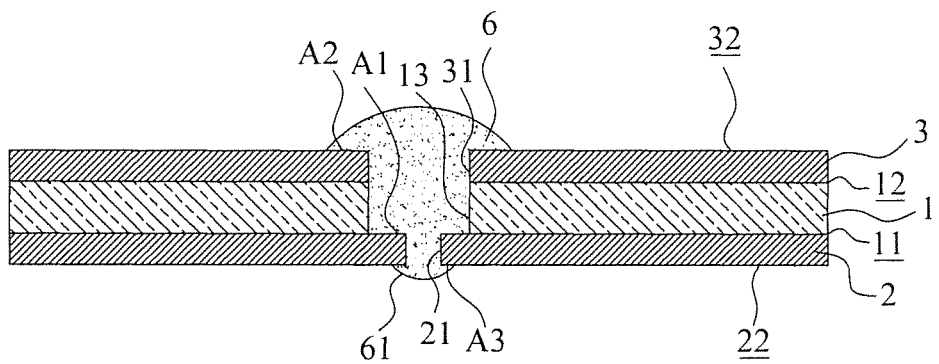
FIG. 7 is a schematic view illustrating removal of the upper covering layer and the lower covering layer of FIG. 6.

As shown in FIG. 7, after the filling of the conductive paste layer 6 is completed, before the conductive paste layer 6 is still in a slurry form and not solidified, the upper covering layer 4 and the lower covering layer 5 are removed (Step 109).

Figure 8:
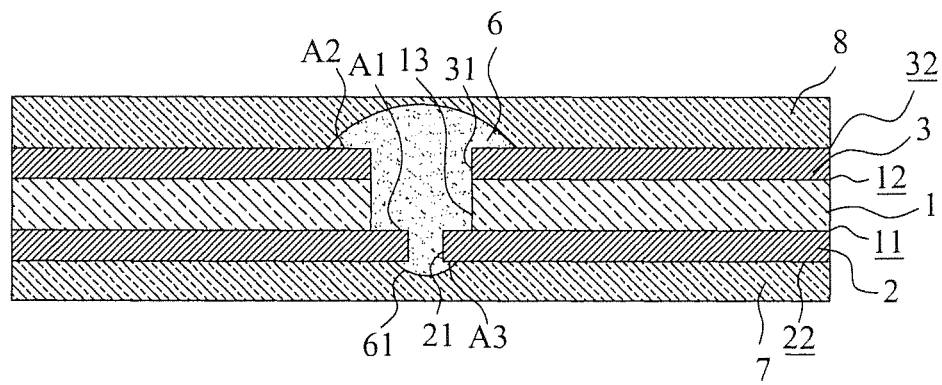
FIG. 8 is a schematic view illustrating formation of a first insulation layer on a bottom surface of the first conductive layer and formation of a second insulation layer on atop surface of the second conductive layer of FIG. 7.
Figure 9:
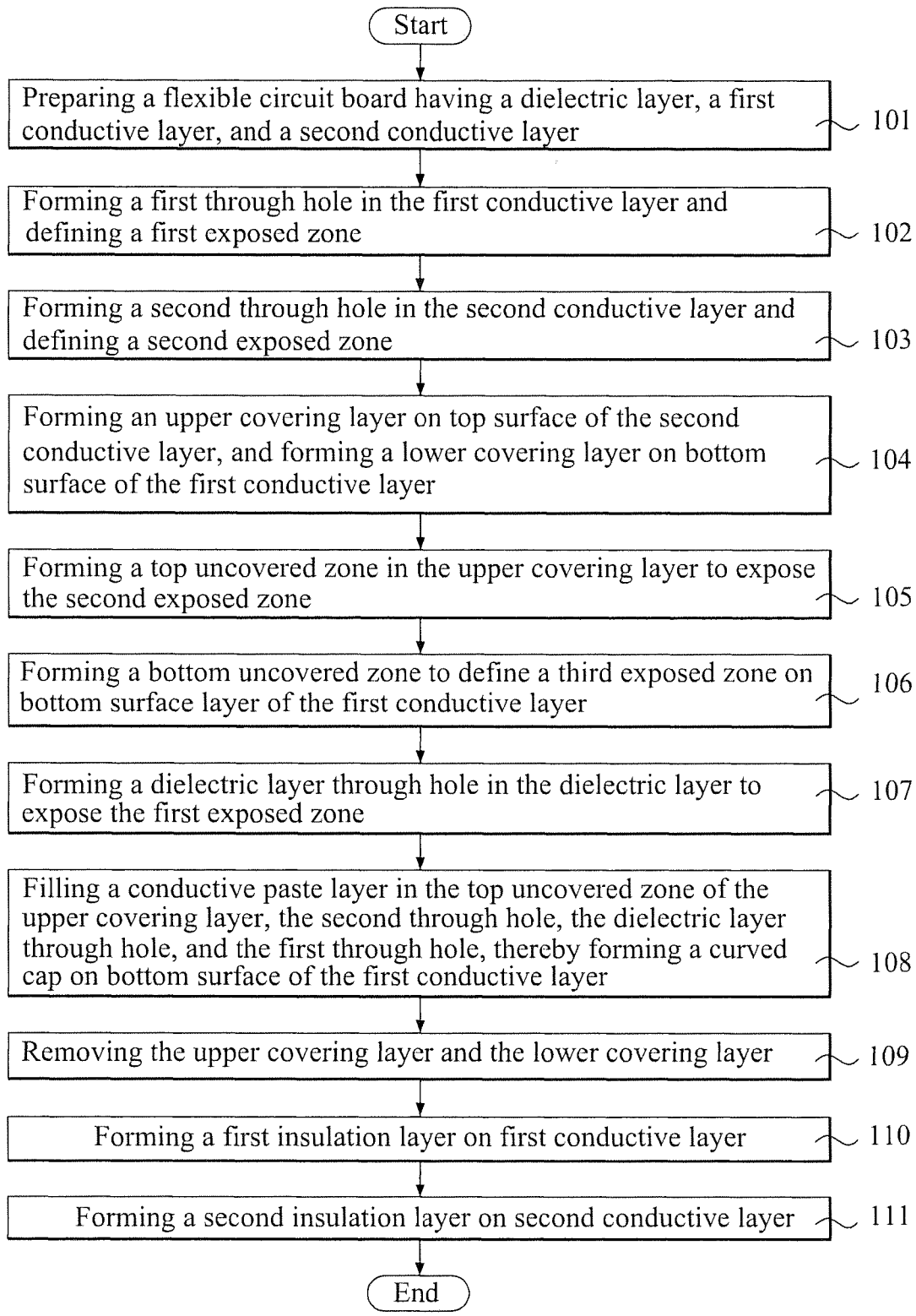
FIG. 9 is a flow chart illustrating the first embodiment of the present invention.

As shown in FIG. 8, finally, a first insulation layer 7 is formed on the bottom surface 22 of the first conductive layer 2 (Step 110) and a second insulation layer 8 is formed on the top surface 32 of the second conductive layer 3 and a surface of the conductive paste layer 6 (Step 111), they serving as protection layers.

After the above steps of the manufacturing process according to the present invention are finished, a microvia structure according to the present invention is formed and comprises:

a dielectric layer 1, a first conductive layer 2, and a second conductive layer 3, in which the first conductive layer 2 and the second conductive layer 3 are respectively formed on a first surface 11 and a second surface 12 of the dielectric layer 1.

The first conductive layer 2 comprises a first through hole 21. The first conductive layer 2 has a bottom surface 22 and defines a first exposed zone A1 on a surface thereof that is opposite to the bottom surface 22 in a circumferential area adjacent to the first through hole 21.

The second conductive layer 3 comprises a second through hole 31. The second conductive layer 3 has a top surface 32 and defines a second exposed zone A2 on the top surface 32 in a circumferential area adjacent to the second through hole 31. The second through hole 31 corresponds to the first through hole 21 of the first conductive layer 2 and the second through hole 31 has a diameter greater than a diameter of the first through hole 21.

The dielectric layer 1 comprises a dielectric layer through hole 13 corresponding to the second through hole 31 of the second conductive layer 3 so as to expose the first exposed zone A1 of the first conductive layer 2.

A conductive paste layer 6 is filled in the second through hole 31 of the second conductive layer 3, the dielectric layer through hole 13 of the dielectric layer 1, and the first through hole 21 of the first conductive layer 2 and the conductive paste layer 6 covers and electrically contacts the first exposed zone A1 of the first conductive layer 2 and the second exposed zone A2 of the second conductive layer 3. In a preferred embodiment of the present invention, when the conductive paste layer 6 is filled in the first through hole 21 of the first conductive layer 2, a bottom part of the conductive paste layer 6 projects beyond the bottom surface 22 of the first conductive layer 2 so as to form a curved cap 61 on the bottom surface 22 of the first conductive layer 2. The curved cap 61 covers and electrically contacts the third exposed zone A3 of the first conductive layer 2.

Referring to FIGS. 10-15, schematic views, in a sectioned form, are given to illustrate the manufacture of a microvia structure of a flexible circuit board according to a second embodiment of the present invention. FIG. 16 is a flow chart illustrating the process of the second embodiment of the present invention. The constituent components and the manufacturing process of the instant embodiment are similar to those of the previously described first embodiment so that identical components are designated with the same reference numerals for consistency. The structure and the manufacturing method of the second embodiment of the present invention will be described with reference to FIGS. 10-16.

Figure 10:
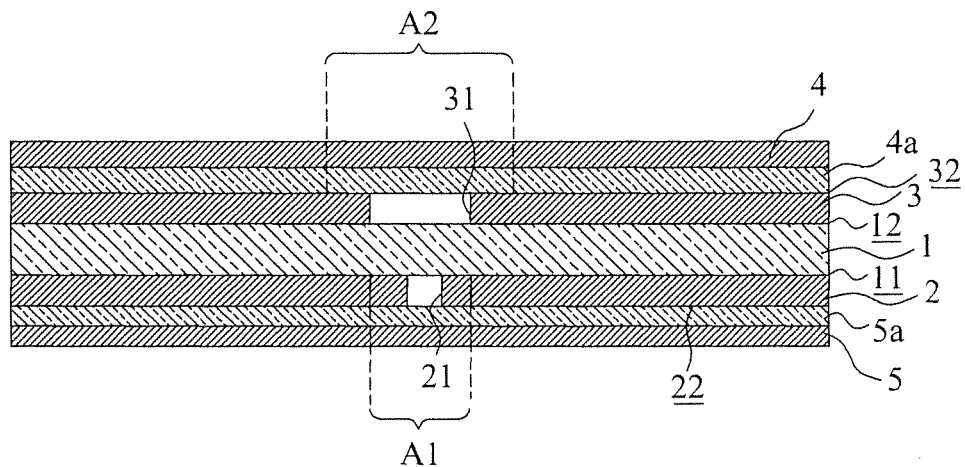
FIG. 10 is a schematic view illustrating formation of an upper covering layer and a lower covering layer on the flexible circuit board of FIG. 3 according to a second embodiment of the present invention.

In putting the second embodiment of the present invention into practice, a flexible circuit board 100 similar to that shown in FIGS. 2 and 3 for the first embodiment is first prepared. Then, as shown in FIG. 10, an upper covering layer 4 and a lower covering layer 5 are formed on the flexible circuit board 100 (Step 104a). In the instant embodiment, the upper covering layer 4 has a bottom surface that comprises an upper protective layer 4a formed thereon and the lower covering layer 5 has a top surface that comprises a lower protective layer 5a formed thereon.

Figure 11:
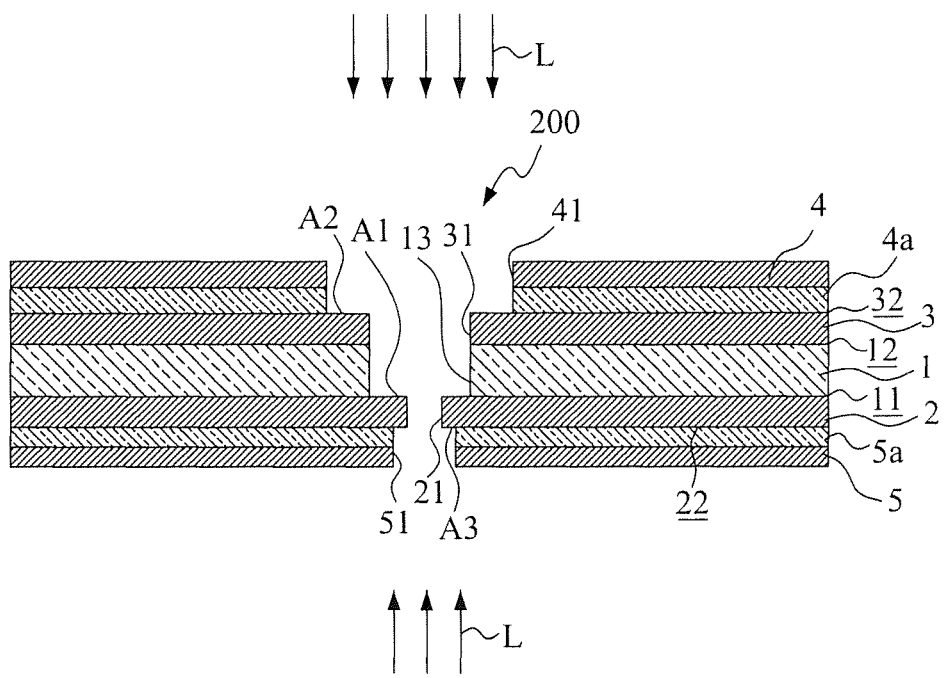
FIG. 11 is a schematic view illustrating formation of a micro hole structure in the flexible circuit board of FIG. 10.

Afterwards, as shown in FIG. 11, a laser energy L or other means is applied to form a top uncovered zone 41 in both the upper covering layer 4 and the upper protective layer 4a (Step 105). The top uncovered zone 41 corresponds exactly to the second exposed zone A2, so as to expose the second exposed zone A2 of the second conductive layer 3.

A bottom uncovered zone 51 is also formed in both the lower covering layer 5 and the lower protective layer 5a (Step 106). The bottom uncovered zone 51 has a diameter greater than the diameter of the first through hole 21 of the first conductive layer 2 so as to define a third exposed zone A3 on the bottom surface 22 of the first conductive layer 2.

Further, the second conductive layer 3 can be used as a mask to form a dielectric layer through hole 13 in the dielectric layer 1 to correspond to the second through hole 31 (Step 107). Since the dielectric layer through hole 13 corresponds to the second through hole 31 of the second conductive layer 3, the first exposed zone A1 of the first conductive layer 2 is exposed. After the above steps, a micro hole structure 200 is formed in the flexible circuit board 100.

Figure 12:
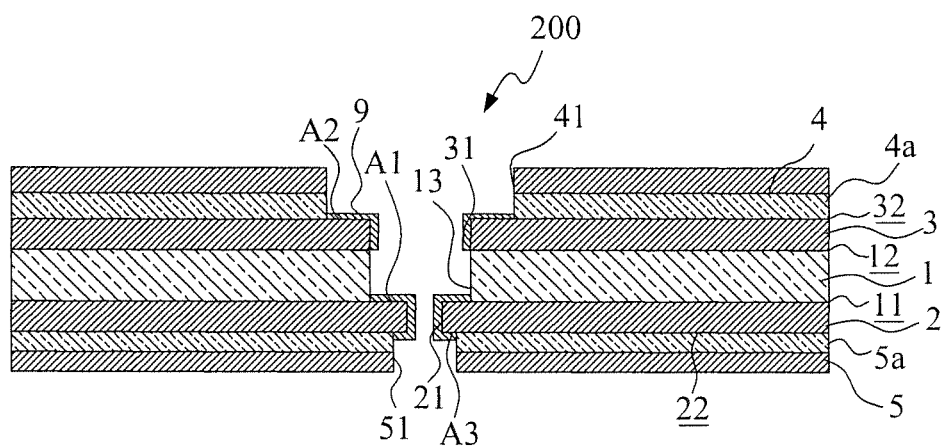
FIG. 12 is a schematic view illustrating formation of an autoxidation layer through a surface autoxidation treatment applied to the micro hole structure of FIG. 11.

As shown in FIG. 12, after the formation of the micro hole structure 200, a surface antioxidation treatment is performed so as to form an antioxidation layer 9 on a surface of each of the second exposed zone A2, the second through hole 31, the first exposed zone A1, and the first through hole 21 (Step 108a). The surface antioxidation treatment can be performed by using a conventional way of metal surface electroplating and during the electroplating process, the upper protective layer 4a and the lower protective layer 5a help prevent invasion of a electroplating solution into a gap between the first conductive layer 2 and the dielectric layer 1 and a gap between the second conductive layer 3 and the dielectric layer 1.

Figure 13:
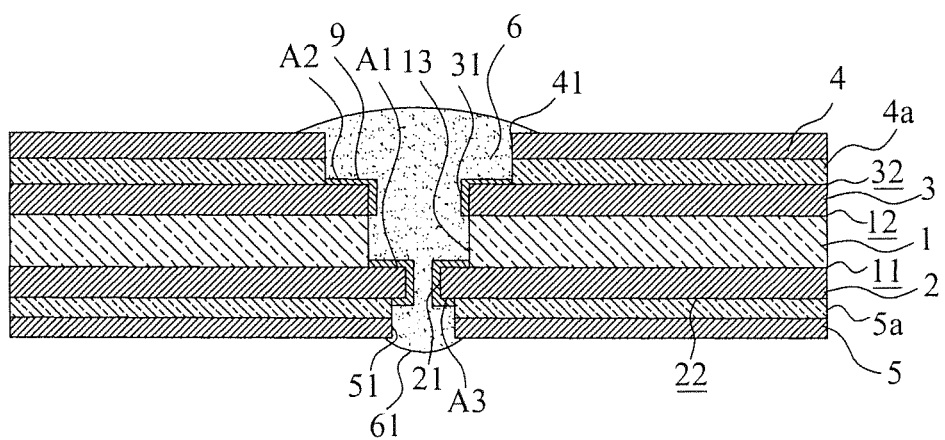
FIG. 13 is a schematic view illustrating filling of a conductive paste layer in the micro hole structure of FIG. 12.

Then, as shown in FIG. 13, a conductive paste layer 6 filled in the top uncovered zone 41 of the upper covering layer 4, the second through hole 31 of the second conductive layer 3, the dielectric layer through hole 13 of the dielectric layer 1, and the first through hole 21 of the first conductive layer 2 (Step 108) in such a way that the conductive paste layer 6 covers and electrically contacts the first exposed zone A1 of the first conductive layer 2 and the second exposed zone A2 of the second conductive layer 3.

When the conductive paste layer 6 is filled into the first through hole 21 of the first conductive layer 2, a bottom part of the conductive paste layer 6 extends through the first through hole 21 of the first conductive layer 2 and projects beyond the bottom surface 22 of the first conductive layer 2 so as to form a curved cap 61 on the bottom surface 22 of the first conductive layer 2. The curved cap 61 covers and electrically contacts the third exposed zone A3 of the first conductive layer 2.

Figure 14:
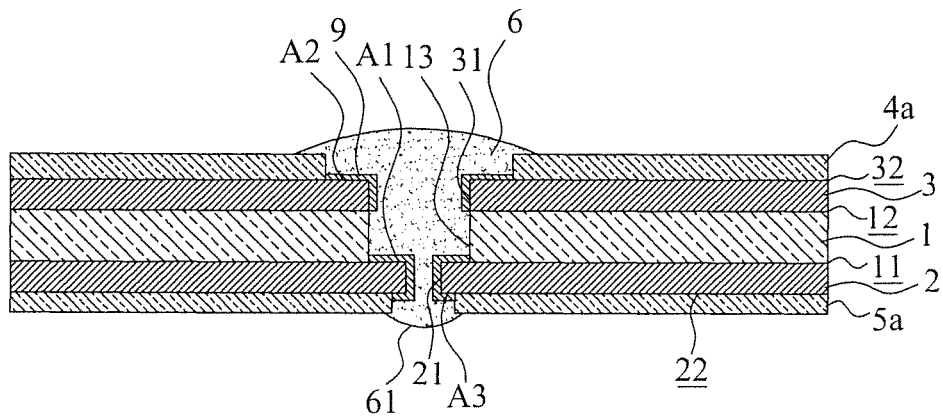
FIG. 14 is a schematic view illustrating removal of the upper covering layer and the lower covering layer of FIG. 13.

As shown in FIG. 14, after the filling of the conductive paste layer 6 is completed, before the conductive paste layer 6 is still in a slurry form and not solidified, the upper covering layer 4 and the lower covering layer 5 are removed (Step 109a) with the upper protective layer 4a kept on the top surface 32 of the second conductive layer 3 and the lower protective layer 5a kept on the bottom surface 22 of the first conductive layer 2.

Figure 15:
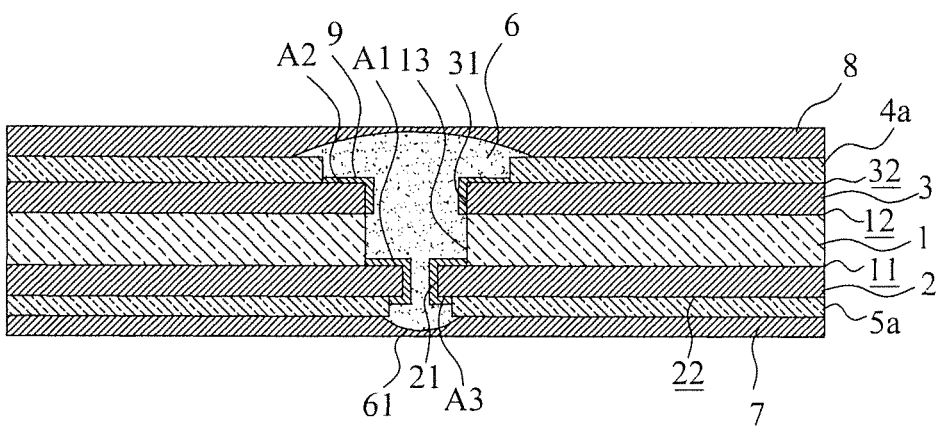
FIG. 15 is a schematic view illustrating formation of a first insulation layer on a bottom surface of the first conductive layer and formation of a second insulation layer on a top surface of the second conductive layer of FIG. 14.
Figure 16:
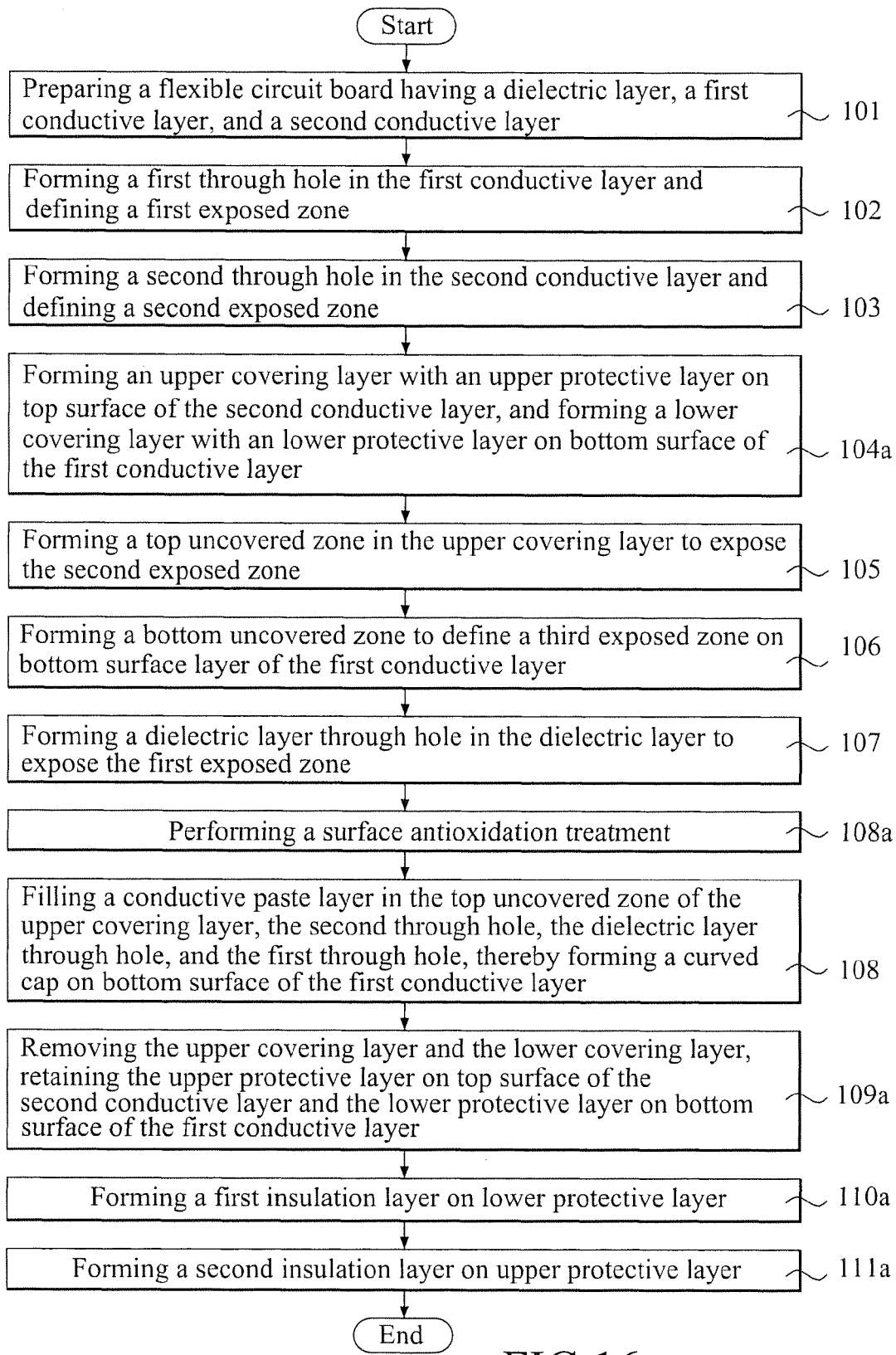
FIG. 16 is a flow chart illustrating the second embodiment of the present invention.

As shown in FIG. 15, finally, a first insulation layer 7 is formed on a bottom surface of the lower protective layer 5a (Step 110a) and a second insulation layer 8 is formed on a surface of the upper protective layer 4a and a surface of the conductive paste layer 6 (Step 111a) to serve as protection layers.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A microvia structure of a flexible circuit board having a dielectric layer, a first conductive layer, and a second conductive layer, wherein the first conductive layer and the second conductive layer are respectively formed on a first surface and a second surface of the dielectric layer, comprising:
    a first through hole formed in the first conductive layer which has a bottom surface and defines a first exposed zone on a surface that is opposite to the bottom surface in a circumferential area adjacent to the first through hole;
    a second through hole formed in the second conductive layer which has a top surface and defines a second exposed zone on the top surface in a circumferential area adjacent to the second through hole, the second through hole corresponding to the first through hole of the first conductive layer and the second through hole having a diameter greater than a diameter of the first through hole;
    a dielectric layer through hole formed in the dielectric layer, corresponding to the second through hole of the second conductive layer so as to expose the first exposed zone of the first conductive layer;
    a conductive paste layer filled in the second through hole of the second conductive layer, the dielectric layer through hole of the dielectric layer, and the first through hole of the first conductive layer in such a way that the conductive paste layer covers and electrically contacts the first exposed zone of the first conductive layer, the second exposed zone of the second conductive layer, and a third exposed zone defined on the bottom surface of the first conductive layer about the first through hole; and
    a first insulation layer set on and covering the bottom surface of the first conductive layer, wherein a lower protective layer is interposed between the bottom surface of the first conductive layer and the first insulation layer.

2. The microvia structure of the flexible circuit board as claimed in claim 1, wherein the conductive paste layer is filled in the first through hole of the first conductive layer in such a way that a bottom part of the conductive paste layer projects beyond the bottom surface of the first conductive layer so as to form a curved cap on the bottom surface of the first conductive layer.

3. The microvia structure of the flexible circuit board as claimed in claim 1, wherein the conductive paste layer is made of one of silver, aluminum, copper, conductive carbon paste, adhesive material containing conductive particles.

4. The microvia structure of the flexible circuit board as claimed in claim 1 further comprising a second insulation layer set on and covering the top surface of the second conductive layer and the conductive paste layer.

5. The microvia structure of the flexible circuit board as claimed in claim 4, wherein the top surface of the second conductive layer and the second insulation layer further comprise an upper protective layer interposed therebetween.

6. The microvia structure of the flexible circuit board as claimed in claim 1, wherein the second through hole, the dielectric layer through hole, the first through hole, the first exposed zone, the second exposed zone each have a surface on which an antioxidation layer is formed.

7. A microvia structure of a flexible circuit board having a dielectric layer, a first conductive layer, and a second conductive layer, wherein the first conductive layer and the second conductive layer are respectively formed on a first surface and a second surface of the dielectric layer, comprising:
    a first through hole formed in the first conductive layer which has a bottom surface and defines a first exposed zone on a surface that is opposite to the bottom surface in a circumferential area adjacent to the first through hole;
    a second through hole formed in the second conductive layer which has a top surface and defines a second exposed zone on the top surface in a circumferential area adjacent to the second through hole, the second through hole corresponding to the first through hole of the first conductive layer and the second through hole having a diameter greater than a diameter of the first through hole;
    a dielectric layer through hole formed in the dielectric layer, corresponding to the second through hole of the second conductive layer so as to expose the first exposed zone of the first conductive layer;
    a conductive paste layer filled in the second through hole of the second conductive layer, the dielectric layer through hole of the dielectric layer, and the first through hole of the first conductive layer in such a way that the conductive paste layer covers and electrically contacts the first exposed zone of the first conductive layer and the second exposed zone of the second conductive layer, wherein the conductive paste layer is filled in the first through hole of the first conductive layer in such a way that a bottom part of the conductive paste layer projects beyond the bottom surface of the first conductive layer so as to form a curved cap on the bottom surface of the first conductive layer; and
    a first insulation layer set on and covering the bottom surface of the first conductive layer, wherein a lower protective layer is interposed between the bottom surface of the first conductive layer and the first insulation layer.

8. A microvia structure of a flexible circuit board having a dielectric layer, a first conductive layer, and a second conductive layer, wherein the first conductive layer and the second conductive layer are respectively formed on a first surface and a second surface of the dielectric layer, comprising:
    a first through hole formed in the first conductive layer which has a bottom surface and defines a first exposed zone on a surface that is opposite to the bottom surface in a circumferential area adjacent to the first through hole;
    a second through hole formed in the second conductive layer which has a top surface and defines a second exposed zone on the top surface in a circumferential area adjacent to the second through hole, the second through hole corresponding to the first through hole of the first conductive layer and the second through hole having a diameter greater than a diameter of the first through hole;
    a dielectric layer through hole formed in the dielectric layer, corresponding to the second through hole of the second conductive layer so as to expose the first exposed zone of the first conductive layer; and a conductive paste layer filled in the second through hole of the second conductive layer, the dielectric layer through hole of the dielectric layer, and the first through hole of the first conductive layer in such a way that the conductive paste layer covers and electrically contacts the first exposed zone of the first conductive layer and the second exposed zone of the second conductive layer, wherein the second through hole, the dielectric layer through hole, the first through hole, the first exposed zone, the second exposed zone each have a surface on which an antioxidation layer is formed.

9. The microvia structure of the flexible circuit board as claimed in claim 8 further comprising a third exposed zone defined on the bottom surface of the first conductive layer about the first through hole, wherein the conductive paste layer further covers and electrically contacts the third exposed zone.

10. A microvia structure of a flexible circuit board having a dielectric layer, a first conductive layer, and a second conductive layer, wherein the first conductive layer and the second conductive layer are respectively formed on a first surface and a second surface of the dielectric layer, comprising:
   a first through hole formed in the first conductive layer which has a bottom surface and defines a first exposed zone on a surface that is opposite to the bottom surface in a circumferential area adjacent to the first through hole;
   a second through hole formed in the second conductive layer which has a top surface and defines a second exposed zone on the top surface in a circumferential area adjacent to the second through hole, the second through hole corresponding to the first through hole of the first conductive layer and the second through hole having a diameter greater than a diameter of the first through hole;
   a dielectric layer through hole formed in the dielectric layer, corresponding to the second through hole of the second conductive layer so as to expose the first exposed zone of the first conductive layer;
   a conductive paste layer filled in the second through hole of the second conductive layer, the dielectric layer through hole of the dielectric layer, and the first through hole of the first conductive layer in such a way that the conductive paste layer covers and electrically contacts the first exposed zone of the first conductive layer, the second exposed zone of the second conductive layer, and a third exposed zone defined on the bottom surface of the first conductive layer about the first through hole; and
   an insulation layer set on and covering the top surface of the second conductive layer and the conductive paste layer, wherein an upper protective layer is interposed between the top surface of the second conductive layer and the insulation layer.

* * * * *